US012681072B2

(12) United States Patent
Yang et al.

(10) Patent No.:  US 12,681,072 B2
(45) Date of Patent:    Jul. 14, 2026

(54) SUBSTRATE INSPECTION APPARATUS AND METHOD OF INSPECTING A SUBSTRATE USING THE SAME

(71) Applicant: SAMSUNG ELECTRONICS CO., LTD., Suwon-si (KR)

(72) Inventors: Jaewon Yang, Suwon-si (KR); Younghoon Sohn, Suwon-si (KR); Souk Kim, Suwon-si (KR); Jaeho Kim, Suwon-si (KR); Jongbeom Kim, Suwon-si (KR); HyeonBo Shim, Suwon-si (KR); Minho Rim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 154 days.

(21) Appl. No.: 18/790,237

(22) Filed: Jul. 31, 2024

(65) Prior Publication Data

US 2025/0147096 A1    May 8, 2025

(30) Foreign Application Priority Data

Nov. 7, 2023    (KR) ........................ 10-2023-0152576

(51) Int. Cl.
 *G01R 31/265*    (2006.01)
(52) U.S. Cl.
 CPC ............................... *G01R 31/2656* (2013.01)
(58) Field of Classification Search
 CPC .......... G01R 31/2656; G01N 21/8806; G01N 21/17; G01N 2021/8845; G01N 2201/06113
 See application file for complete search history.

(56) References Cited

U.S. PATENT DOCUMENTS

| | | | |
|---|---|---|---|
| 6,886,423 B2 | 5/2005 | Wolf | |
| 7,050,178 B2 | 5/2006 | Morath et al. | |
| 7,365,836 B2 | 4/2008 | Some | |
| 7,372,584 B2 | 5/2008 | Wolf | |
| 7,450,618 B2 | 11/2008 | Dantus et al. | |
| 7,705,974 B2 | 4/2010 | Wolf et al. | |
| 8,929,406 B2 | 1/2015 | Chuang et al. | |

(Continued)

FOREIGN PATENT DOCUMENTS

CN             116087111         5/2023

OTHER PUBLICATIONS

Kanavin et al., "Heat transport in metals irradiated by ultrashort laser pulses," Phys. Rev., Jun. 15, 1998, B57, 14698, 9 pages.

(Continued)

*Primary Examiner* — Alvaro E Fortich
(74) *Attorney, Agent, or Firm* — Fish & Richardson P.C.

(57)                ABSTRACT

A substrate inspection apparatus includes a laser light source configured to emit a laser beam, an optical splitter configured to split the laser beam into a first laser beam and a second laser beam, a delay stage configured to change a relative time delay of the second laser beam and optically connected to the optical splitter, a first modulator optically connected to the optical splitter and configured to change the first laser beam, and a feedback system configured to sense the second laser beam reflected from a substrate and configured to apply electrical feedback to the first modulator.

15 Claims, 9 Drawing Sheets

(56)         References Cited

U.S. PATENT DOCUMENTS

| | | | |
|---|---|---|---|
| 11,668,644 B2 | 6/2023 | Antonelli et al. | |
| 2003/0030817 A1* | 2/2003 | Lee ...................... | G01B 11/00 |
| | | | 356/491 |
| 2014/0140652 A1* | 5/2014 | Aflatouni ............... | G02F 1/011 |
| | | | 385/3 |
| 2020/0185240 A1* | 6/2020 | Kim ................... | G01N 21/8806 |
| 2021/0305106 A1* | 9/2021 | Jeang ................... | H10P 74/203 |
| 2022/0091047 A1* | 3/2022 | Romanovsky ..... | G01N 21/9501 |
| 2022/0413029 A1 | 12/2022 | Koldiaev et al. | |

OTHER PUBLICATIONS

Kim et al., "Compensation of laser propagation effects within solids for high harmonic generation of extreme ultraviolet radiation," Optics and Laser Technology, Jan. 2022, vol. 145, 107507, 6 pages.
Rosencwaig et al., "Theory of the photoacoustic effect with solids," Journal of Applied Physics, Jan. 1976, 47(1):64-69.
Sun et al., "Photoacoustic wavefront shaping with high signal to noise ratio for light focusing through scattering media," Scientific Reports, available online Mar. 13, 2019, vol. 9, 1-10.

* cited by examiner

SUBSTRATE INSPECTION APPARATUS AND METHOD OF INSPECTING A SUBSTRATE USING THE SAME

CROSS-REFERENCE TO RELATED APPLICATIONS

This U.S. non-provisional patent application claims priority under 35 U.S.C. § 119 to Korean Patent Application No. 10-2023-0152576, filed on Nov. 7, 2023, in the Korean Intellectual Property Office, the entire contents of which are hereby incorporated by reference.

BACKGROUND OF THE INVENTION

The present disclosure relates to a substrate inspection apparatus and a method of inspecting a substrate using the same, and more particularly, to a substrate inspection apparatus capable of inspecting or observing a substrate in detail by modulating laser in time and space and a method of inspecting a substrate using the same.

As semiconductor devices have been highly integrated, layers and internal interconnection lines in semiconductor devices have been complicated. Internal defects in semiconductor devices may greatly affect reliability and performance of the semiconductor devices, and thus techniques for inspecting the internal defects may be important.

SUMMARY

A substrate inspection apparatus is provided capable of changing an intensity of laser for each frequency and a method of inspecting a substrate using the same.

A substrate inspection apparatus is provided capable of changing a wavefront of laser and a method of inspecting a substrate using the same.

A substrate inspection apparatus is provided capable of inspecting an internal structure of a substrate in detail and a method of inspecting a substrate using the same.

A substrate inspection apparatus is provided capable of intensively inspecting a desired layer in a substrate and a method of inspecting a substrate using the same.

In an aspect, a substrate inspection apparatus may include a laser light source configured to emit a laser beam, an optical splitter configured to split the laser beam into a first laser beam and a second laser beam, a delay stage configured to change a relative time delay of the second laser beam with respect to the first laser beam and optically connected to the optical splitter, a first modulator optically connected to the optical splitter and configured to change the first laser beam, and a feedback system configured to sense the second laser beam reflected from a substrate and configured to apply electrical feedback to the first modulator.

In an aspect, a substrate inspection apparatus may include a laser light source configured to emit a femtosecond laser beam, an optical splitter configured to split the femtosecond laser beam into a first laser beam and a second laser beam, a delay stage configured to receive the second laser beam from the optical splitter and configured to change a relative time delay of the second laser beam with respect to the first laser beam, a modulator optically connected to the optical splitter and configured to change the second laser beam, and a feedback system configured to sense the second laser beam reflected from a substrate and electrically connected to the modulator.

In an aspect, a method of inspecting a substrate may include disposing a substrate in a substrate inspection apparatus, and inspecting the substrate. The substrate inspection apparatus may include a laser light source configured to a emit laser beam, an optical splitter configured to split the laser beam into a first laser beam and a second laser beam, a delay stage configured to receive the second laser beam from the optical splitter and configured to change a frequency of the second laser beam, and a modulator optically connected to the optical splitter or the delay stage and configured to change a wavefront of the laser beam or an intensity of the laser beam for each frequency. The modulator may include an optical modulator configured to change the laser beam. The optical modulator may include a spatial light modulator (SLM) or a piezoelectric transducer (PZT). The inspecting of the substrate may include splitting the laser beam emitted from the laser light source into the first laser beam and the second laser beam by the optical splitter, changing the first laser beam or the second laser beam by the modulator, and irradiating the first laser beam and the second laser beam onto the substrate.

BRIEF DESCRIPTION OF THE DRAWINGS

FIG. 9 is a schematic view illustrating an example substrate inspection.

DETAILED DESCRIPTION

Figure 1:
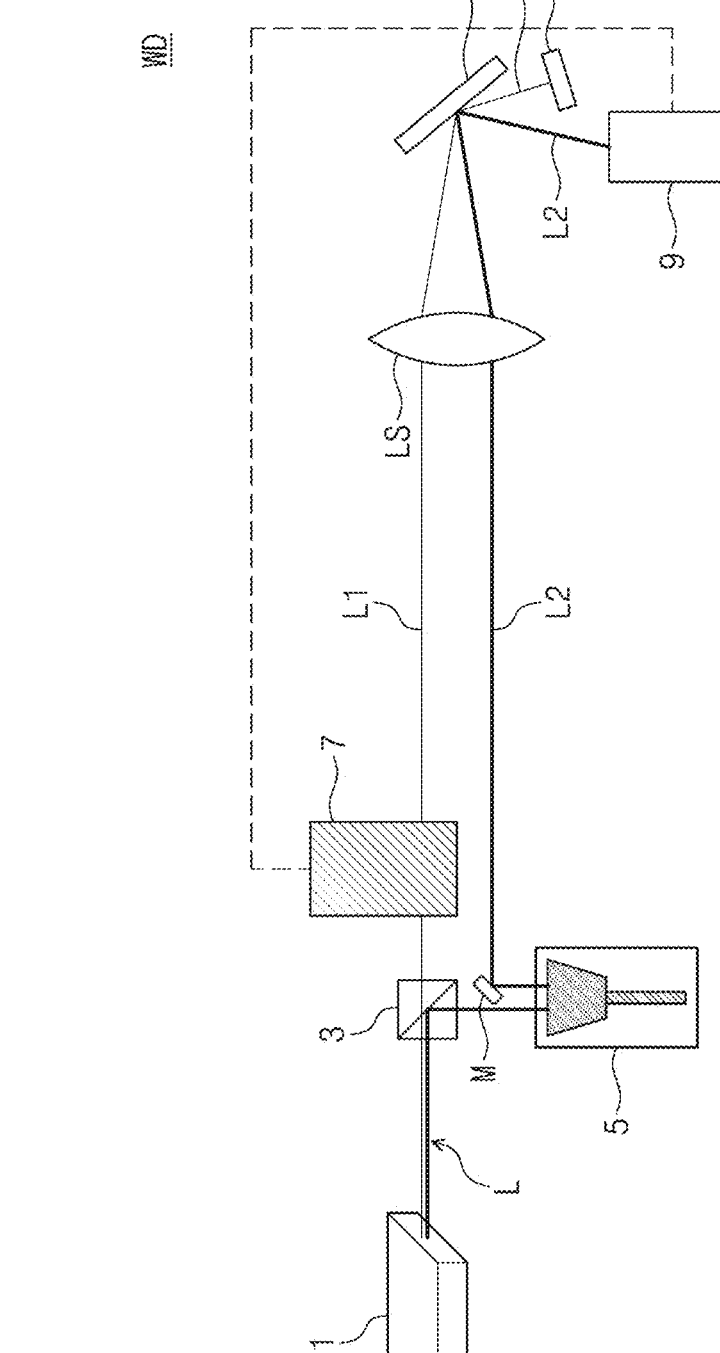
FIG. 1 is a schematic view illustrating an example substrate inspection apparatus.

This disclosure describes in detail with reference to the accompanying drawings the substrate inspection apparatus. The same reference numerals or the same reference designators may denote the same components or elements throughout the specification.

Hereinafter, a reference designator D1 may be referred to as a first direction, a reference designator D2 intersecting the first direction D1 may be referred to as a second direction, and a reference designator D3 intersecting both the first direction D1 and the second direction D2 may be referred to as a third direction. The first direction D1 may also be referred to as an upward direction, and an opposite direction to the first direction D1 may also be referred to as a downward direction. In addition, each of the second direction D2 and the third direction D3 may be referred to as a horizontal direction.

The present disclosure relates to a substrate inspection apparatus and a method of inspecting a substrate using the same, and more particularly, to a substrate inspection apparatus capable of inspecting or observing a substrate in detail by modulating laser in time and space and a method of inspecting a substrate using the same. In a method of inspecting a semiconductor device, the inside of a semiconductor device can be stimulated by first laser, and the response generated from the stimulated semiconductor device can be inspected or observed using second laser.

FIG. 1 is a schematic view illustrating an example substrate inspection apparatus WD.

Referring to FIG. 1, a substrate inspection apparatus WD can include a laser light source unit 1, an optical splitter 3, a delay stage 5, a modulator 7, and a feedback system 9. The laser light source unit 1 can include a femtosecond laser light source. The laser light source unit 1 can be configured to generate laser beam L having a waveform of a pulse shape. The laser light source unit 1 can be configured to emit femtosecond laser L. A pulse width of the femtosecond laser beam L generated from the laser light source unit 1 can range from 10 fs to 60 fs. In the present specification, the laser beam L may mean the femtosecond laser beam L.

The optical splitter 3 can be a beam splitter. The optical splitter 3 can be optically connected to the laser light source unit 1. More particularly, the optical splitter 3 can be configured to receive the laser beam L from the laser light source unit 1. The optical splitter 3 can be configured to split the laser beam L into a plurality of laser beams L1 and L2. In the present specification, the optical splitter 3 can split the laser beam L into two laser beams L1 and L2. More particularly, the optical splitter 3 can split the laser beam L emitted from the laser light source unit 1 into a first laser beam L1 and a second laser beam L2. Hereinafter, a term 'split laser beams L1 and L2' may be used when referring to both the first laser beam L1 and the second laser beam L2. The first laser beam L1 can be a pump laser. The second laser beam L2 can be a probe laser. A intensity of the first laser beam L1 can be different from a intensity of the second laser beam L2. Intensities of the first laser beam L1 and the second laser beam L2 can be adjusted by the optical splitter 3. The first laser beam L1 can be irradiated onto a substrate W. The first laser beam L1 can be irradiated onto the substrate W and can be reflected and/or refracted depending on an internal structure of the substrate W. The intensity, a wavelength, a frequency and/or a waveform of the first laser beam L1 can be changed depending on the internal structure of the substrate W. The second laser beam L2 can also be irradiated onto the substrate W. In other words, the first laser beam L1 and the second laser beam L2 can be irradiated to the same region of the substrate W by a lens LS. Properties of the second laser beam L2 can be changed by the first laser beam L1 which changes the internal structure of the substrate W. The changed second laser beam L2 can be analyzed to analyze the internal structure of the substrate W. The optical splitter 3 can include a cube-type splitter and/or a plate-type splitter. The cube-type splitter can have a shape in which two prisms are adhered to each other. The plate-type splitter can include a glass plate having a surface coated with an anti-reflection layer. However, the components and the shape of the optical splitter 3 are not limited thereto. In certain embodiments, the optical splitter 3 can include other component(s) capable of splitting the laser beam L into a plurality of laser beams. When the optical splitter 3 irradiates the laser beam L onto the glass or the prism, the laser beam L can be split using reflective or refractive properties.

The delay stage 5 can be configured to adjust a relative time delay of the split laser beams L1 and L2. The delay stage 5 can be optically connected to the optical splitter 3. In the present specification, the delay stage 5 can be configured to receive the second laser beam L2 from the optical splitter 3. The delay stage 5 can be configured to change a path length of the second laser beam L2. The delay stage 5 can be configured to change a relative time delay of the second laser beam L2 with respect to the first laser beam L1. The delay stage 5 can be configured to provide the second laser beam L2 having the changed path length toward the modulator 7 or the substrate W. Since the second laser beam L2 having the changed path length is provided, the second laser beam L2 can more greatly react with the first laser beam L1.

The modulator 7 can be configured to change the split laser beams L1 and L2. More particularly, the modulator 7 can be configured to change a waveform of the split laser beams L1 and L2 or an intensity of the split laser beams L1 and L2 for each frequency. However, the function of the modulator 7 is not limited thereto and can include at least one of various structures capable of changing properties of the split laser beams L1 and L2. The modulator 7 can be optically connected to the optical splitter 3. The modulator 7 can be configured to change the first laser beam L1. In certain embodiments, the modulator 7 can be optically connected to the delay stage 5. In this case, the modulator 7 can be configured to change the second laser beam L2. The modulator 7 can be configured to provide the first laser beam L1 or the second laser beam L2 to the substrate W. The modulator 7 can provide the first laser beam L1 or the second laser beam L2 to a reflective mirror M or to the lens LS. A structure of the modulator 7 will be described below in detail.

The feedback system 9 can be electrically connected to the modulator 7. The feedback system 9 can be configured to apply electrical feedback to the modulator 7. The modulator 7 can change a polarization vector of the first laser beam L1 relative to the second laser beam L2 by the electrical feedback of the feedback system 9. The feedback system 9 can sense and analyze the split laser beams L1 and L2. In the present specification, the feedback system 9 can be configured to sense the second laser beam L2. The feedback system 9 can include an optical sensor (not shown) capable of sensing the second laser beam L2. The second laser beam L2 sensed by the feedback system 9 can be the second laser beam L2 which is irradiated to the substrate W and is then reflected. The second laser beam L2 sensed by the feedback system 9 can be the second laser beam L2 of which the wavefront, the frequency, and/or the intensity for each frequency is/are changed by the first laser beam L1. The electrical feedback of the feedback system 9 will be described below in more detail.

The substrate inspection apparatus WD can further include the reflective mirror M and the lens LS. The substrate inspection apparatus WD can change a path of the split laser L1 and L2 by the reflective mirror M. The substrate inspection apparatus WD can focus the split laser beams L1 and L2 by using the lens LS. More particularly, the substrate inspection apparatus WD can irradiate the first laser beam L1 and the second laser beam L2 toward the substrate W by using the lens LS. The lens LS can focus the femtosecond laser beam L, split by the optical splitter 3, again. The reflective mirror M and the lens LS can be optically connected to the delay stage 5, the modulator 7, the optical splitter 3 and the laser light source unit 1.

Figure 2:
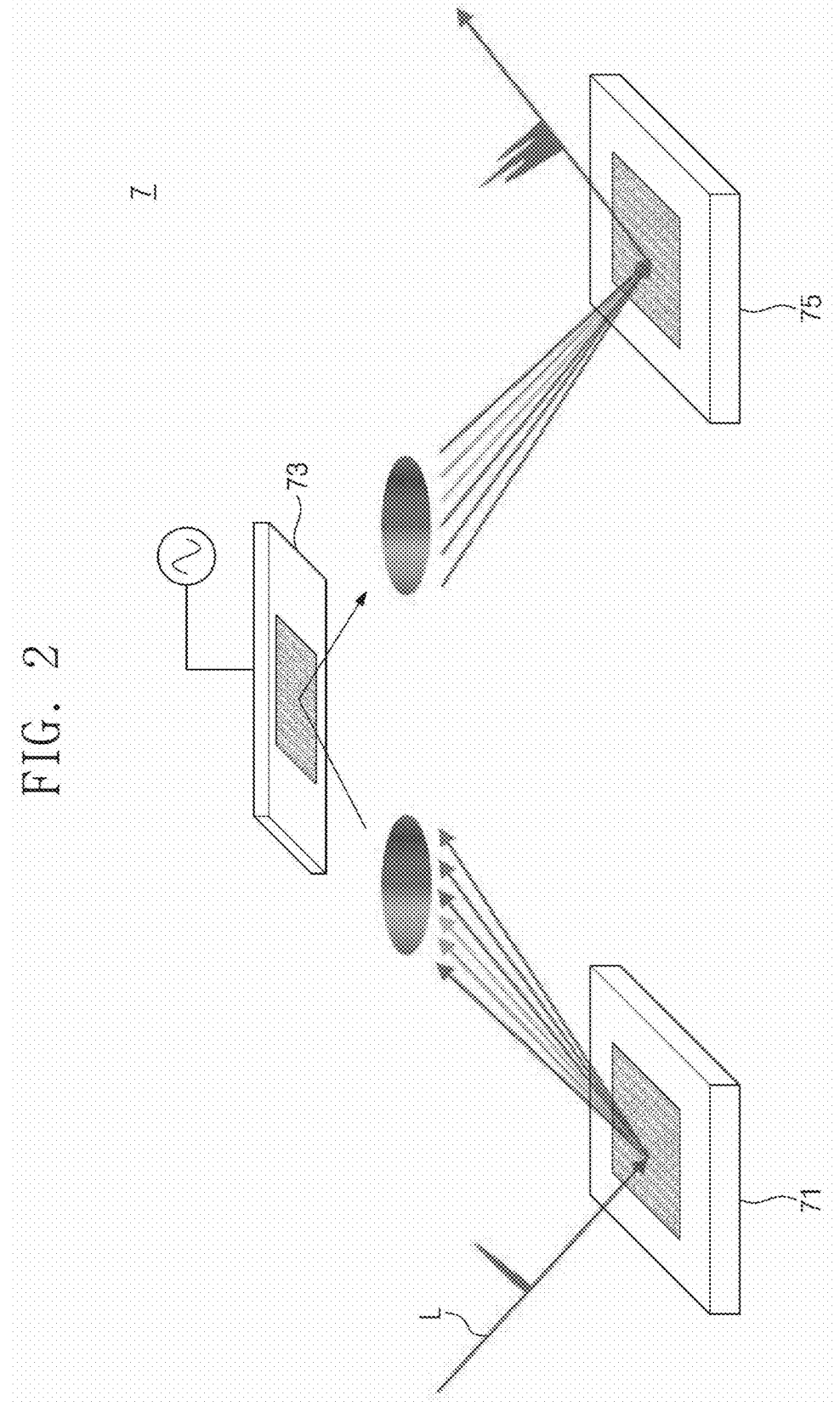
FIG. 2 is a schematic view illustrating an example modulator.
Figure 3:
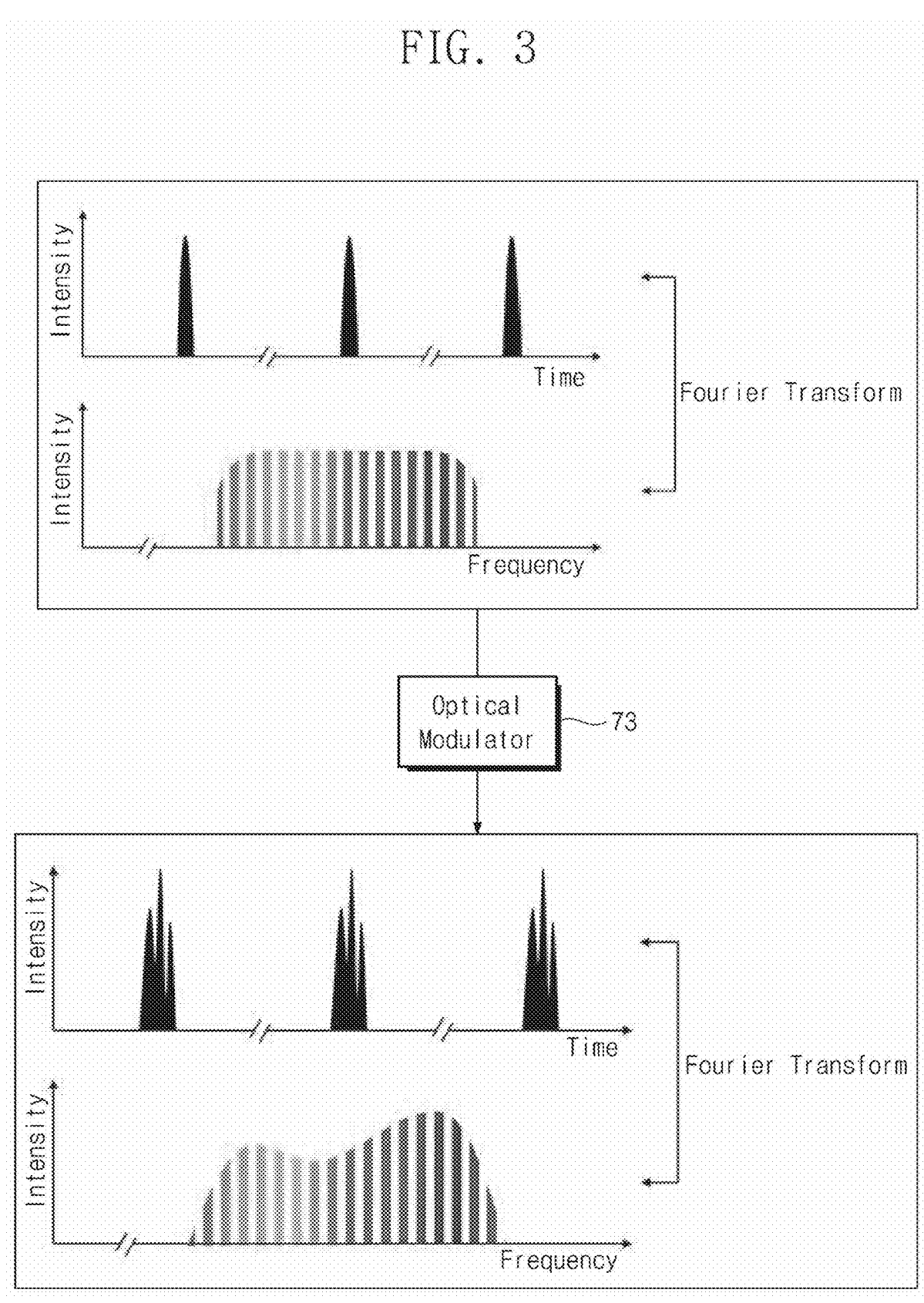
FIG. 3 is a schematic view illustrating cases before and after laser is changed by an optical modulator.
Figure 4:
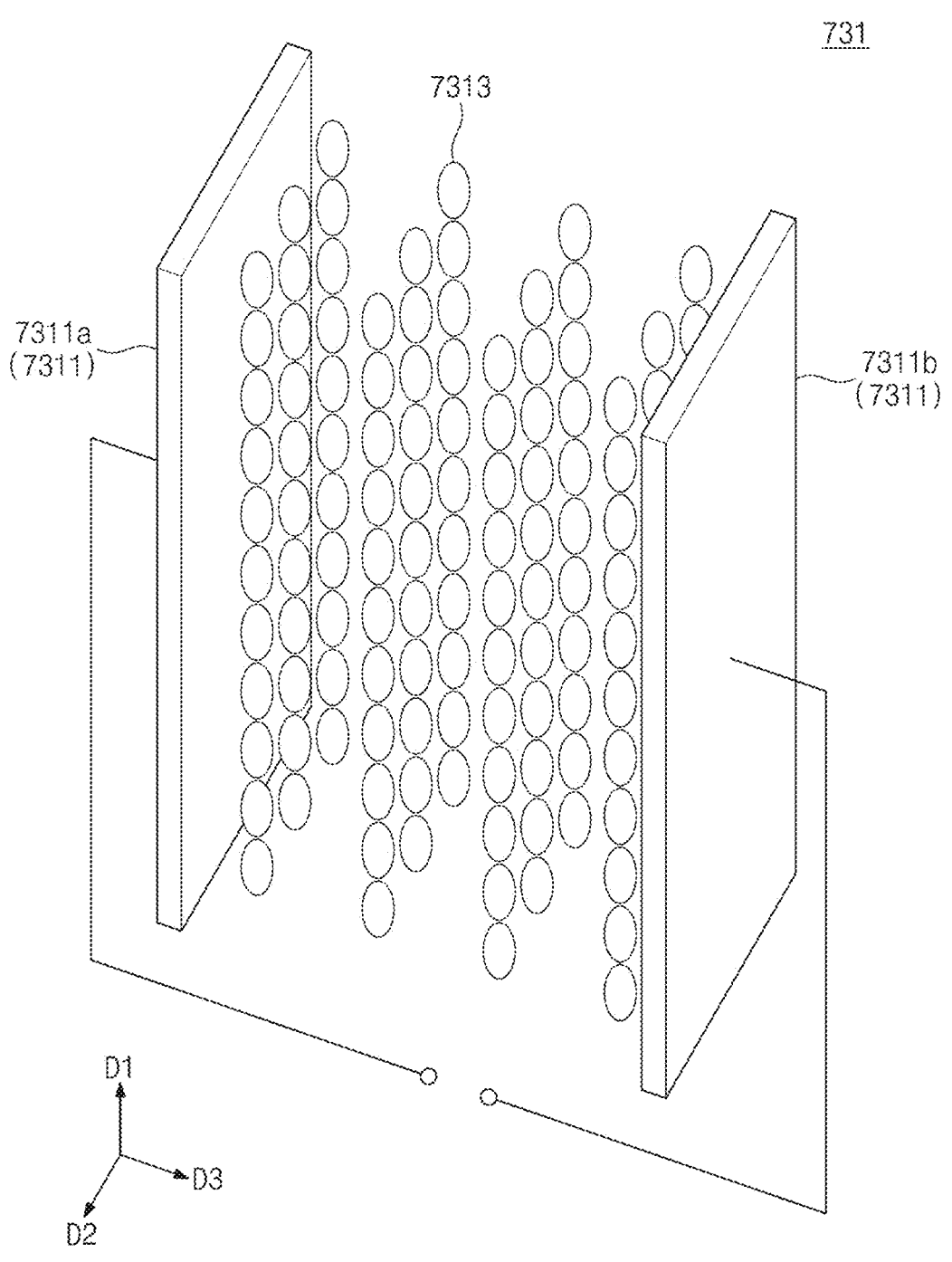
FIG. 4 is a perspective view illustrating an example spatial light modulator (SLM).
Figure 5:
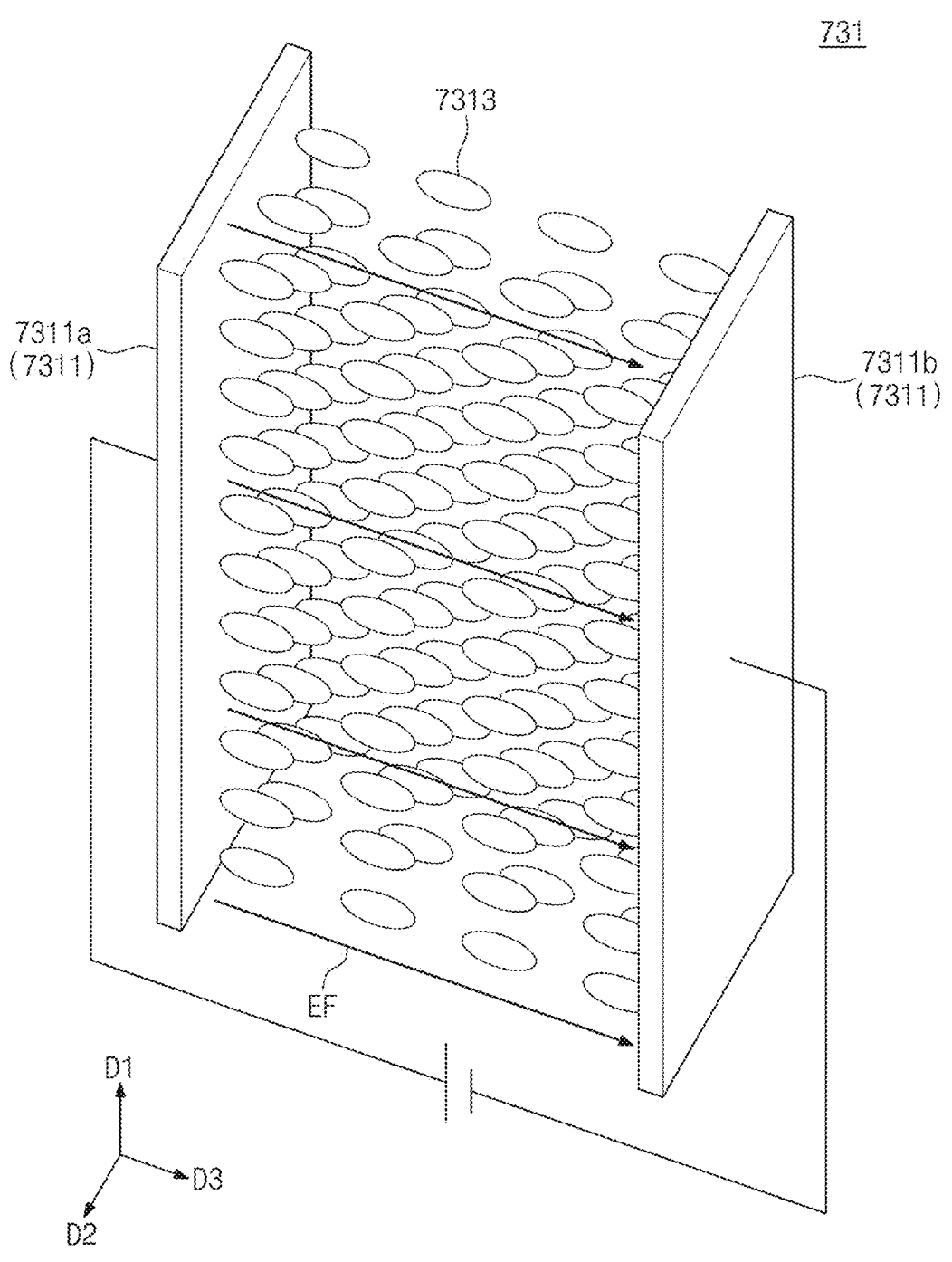
FIG. 5 is a perspective view illustrating an example SLM.

FIG. 2 is a schematic view illustrating an example modulator 7. FIG. 3 is a schematic view illustrating cases before and after split laser beams L1 and L2 can be changed by an optical modulator 73. FIG. 4 is a perspective view illustrating an example spatial light modulator (SLM) 731 under one operating condition. FIG. 5 is a perspective view illustrating an example SLM 731 under another operating condition.

Referring to FIG. 2, the modulator 7 can include an optical modulator 73, a first grating 71, and a second grating 75. Each of the first grating 71 and the second grating 75 can include a plurality of slits arranged at equal distances. The first grating 71 can be optically connected to the optical splitter 3. The optical modulator 73 can be configured to change the split laser beams L1 and L2. The second grating 75 can be configured to focus divided split laser beams L1 and L2. The second grating 75 can be optically connected to the optical modulator 73. The optical modulator 73 can be located between the first grating 71 and the second grating 75. The optical modulator 73 can be configured to change the intensity of the split laser beams L1 and L2 for each wavelength. The first grating 71 can be configured to divide the split laser beams L1 and L2 into a plane. In other words, the split laser beams L1 and L2 having the pulse waveform can be divided by the first grating 71. The second grating 75 can be configured to focus the divided split laser beams L1 and L2. Referring to FIG. 3, a graph having a horizontal axis representing a time and a vertical axis representing an intensity and a graph having a horizontal axis representing a frequency and a vertical axis representing an intensity can be provided. The graphs show the intensity of the laser beam L as a function of the time and also the intensity of the laser beam L as a function of the frequency (e.g., a pulse modulation frequency). The graphs can show the properties of the same laser beam L measured in different views. In other words, the intensity of the laser beam L according to the time and the intensity of the laser beam L according to the frequency can be measured using the Fourier transform. The divided split laser beams L1 and L2 can be incident onto the optical modulator 73. The intensity of the split laser beams L1 and L2 for each wavelength can be changed by the optical modulator 73. The changed split laser beams L1 and L2 can be incident onto the second grating 75. The divided split laser beams L1 and L2 can be focused by the second grating 75. The split laser beams L1 and L2 can revert to the same pulse waveform again by the second grating 75. Referring to FIG. 4, the optical modulator 73 can include a spatial light modulator (SLM) 731. However, in certain implementations, the optical modulator 73 can include another component capable of changing the split laser beams L1 and L2. For example, the optical modulator 73 can include a piezoelectric transducer (PZT) 733. The PZT 733 will be described below in detail. The SLM 731 can be a spatial light modulator. The SLM 731 can be configured to modulate an amplitude, a phase, and a polarization of the laser beam L in two dimensions of space and time. The SLM 731 can be configured to change the phase of the laser beam L depending on a position. Referring to FIG. 4, the SLM 731 can include electrodes 7311 provided at both side surfaces of the SLM 731. The SLM 731 can have a first electrode 7311$a$ and a second electrode 7311$b$. Different voltages can be applied to the first electrode 7311$a$ and the second electrode 7311$b$, respectively. An electric field EF can be formed between the first electrode 7311$a$ and the second electrode 7311$b$ by a difference between the voltages applied to the first electrode 7311$a$ and the second electrode 7311$b$. Crystal molecules 7313 can be located between the first electrode 7311$a$ and the second electrode 7311$b$. The crystal molecules 7313 can have polarity. An alignment direction of the crystal molecules 7313 can be changed by an intensity and a direction of the electric field EF between the first electrode 7311$a$ and the second electrode 7311$b$. Referring to FIG. 5, a positive voltage can be applied to the first electrode 7311$a$. A negative voltage can be applied to the second electrode 7311$b$. The electric field EF directed from left to right can be formed in the SLM 731 by a difference in voltage between the first electrode 7311$a$ and the second electrode 7311$b$.

The crystal molecules 7313 in the SLM 731 can be aligned in the direction of the electric field EF. As the electric field EF becomes stronger, the alignment direction of the crystal molecules 7313 can approach a horizontal direction. As the electric field EF becomes weaker, the alignment direction of the crystal molecules 7313 can approach a vertical direction. A refractive index of the optical modulator 73 can be changed depending on the alignment direction of the crystal molecules 7313. The intensity of the split laser beams L1 and L2 for each wavelength can be changed depending on the refractive index of the optical modulator 73. However, in certain embodiments, the optical modulator 73 can include another component capable of changing the intensity of the split laser beams L1 and L2 for each wavelength, as well as the SLM 731.

Figure 6:
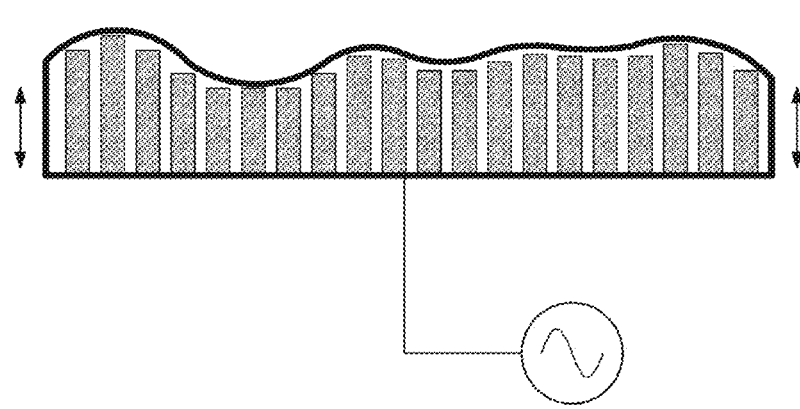
FIG. 6 is a schematic view illustrating an example piezoelectric transducer (PZT).
Figure 7:
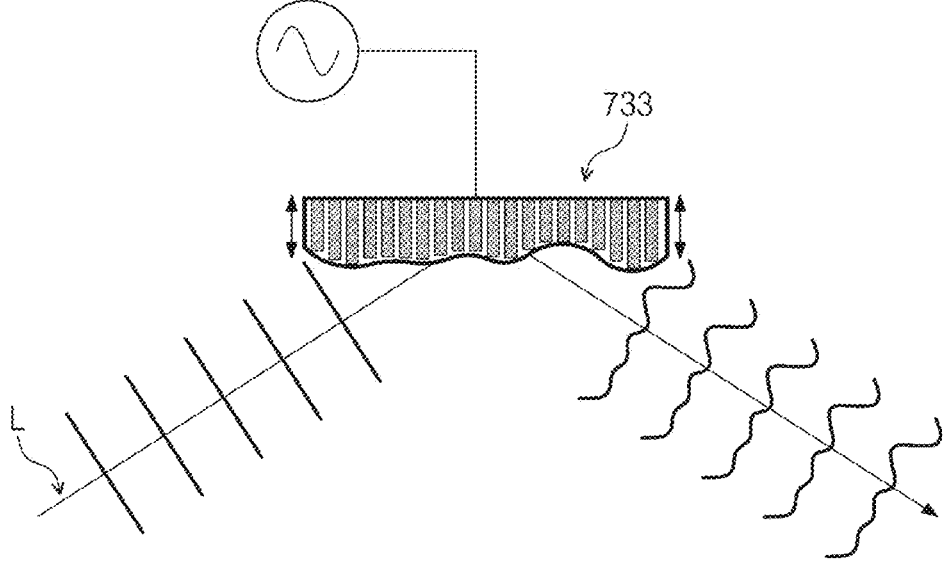
FIG. 7 is a schematic view illustrating cases before and after a wavefront of laser is changed by the PZT.

FIG. 6 is a schematic view illustrating an example piezo-electric transducer (PZT) 733. FIG. 7 is a schematic view illustrating cases before and after a wavefront of the laser beam L is changed by the PZT 733.

Referring to FIG. 6, the PZT 733 can be provided. The optical modulator 73 can include the PZT 733. The optical modulator 73 can include one of the SLM 731 and the PZT 733. The optical modulator 73 can include both the SLM 731 and the PZT 733. The optical modulator 73 can include other component(s) capable of changing the split laser beams L1 and L2 in addition to (or except) the SLM 731 and the PZT 733. The PZT 733 can be a piezoelectric element. The PZT 733 can generate a voltage when receiving external force. On the other hand, a shape of the PZT 733 can be changed when the PZT 733 receives electrical stimulation. When a voltage is applied to the PZT 733, the PZT 733 can be contracted or expanded. When a voltage is applied to the optical modulator 73, a length of the PZT 733 can be changed to change a shape of a surface of the optical modulator 73. Referring to FIG. 7, the wavefront of the split laser beams L1 and L2 can be changed by the optical modulator 73. In the case in which the optical modulator 73 includes the PZT 733, the modulator 7 can not include the gratings 71 and 75. The split laser beams L1 and L2 can have the same wavefront. The first laser beam L1 and the second laser beam L2 can have different wavefronts. When either of the split laser beams L1 and L2 is incident on the optical modulator 73 and is then reflected from the optical modulator 73, the wavefronts of the split laser beams L1 and L2 can be changed depending on the shape of the surface of the optical modulator 73. Since the wavefronts of the split laser beams L1 and L2 are changed, the split laser beams L1 and L2 can more deeply penetrate the inside of the substrate W. Since the wavefronts of the split laser beams L1 and L2 are changed, the inside of the substrate W can be analyzed in more detail by analyzing the split laser beams L1 and L2.

Figure 8:
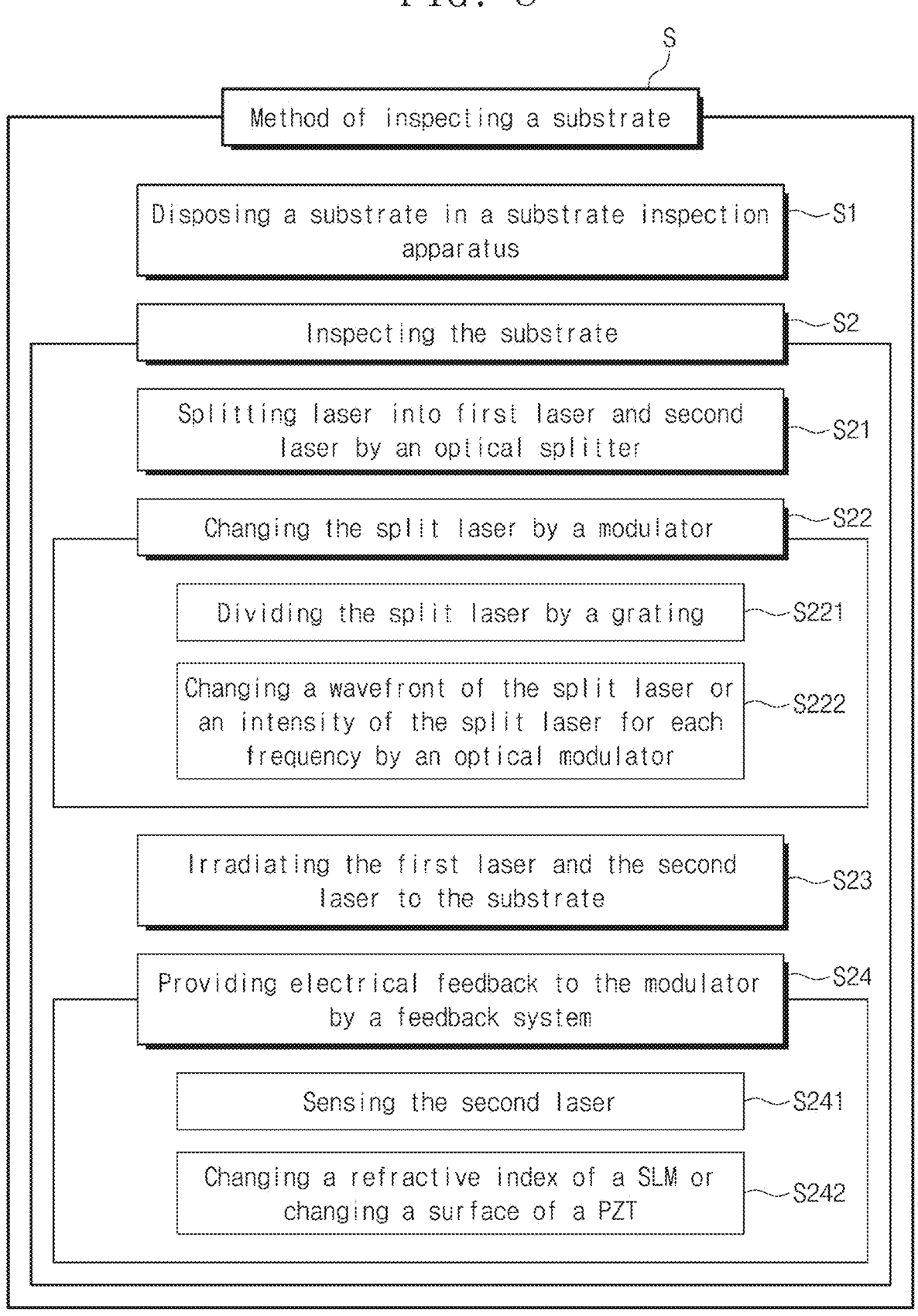
FIG. 8 is a flow chart illustrating an example method of inspecting a substrate.

FIG. 8 is a flow chart illustrating an example method of inspecting a substrate(S).

Referring to FIG. 8, a method of inspecting a substrate(S) can include disposing the substrate W in the substrate inspection apparatus WD (S1) and inspecting the substrate W (S2). The inspecting of the substrate W (S2) can include splitting the laser beam L emitted from the laser light source unit 1 into the first laser beam L1 and the second laser beam L2 by the optical splitter 3 (S21), changing the split laser beams L1 and L2 by the modulator 7 (S22), irradiating the first laser beam L1 and the second laser beam L2 onto the substrate W (S23), and providing electrical feedback to the modulator 7 by the feedback system 9 (S24). The changing of the split laser beams L1 and L2 (S22) can include dividing the split laser beams L1 and L2 by the first grating 71 (S221) and changing the wavefront of the split laser beams L1 and L2 or the intensity of the split laser beams L1 and L2 for each frequency by the optical modulator 73 (S222). The providing of the electrical feedback to the modulator 7 by the feedback system 9 (S24) can include sensing the second laser beam L2 by the feedback system 9 (S241). The providing of the electrical feedback to the modulator 7 (S24) can include changing the refractive index of the SLM 731 or changing the surface of the PZT 733 (S242).

Figure 9:
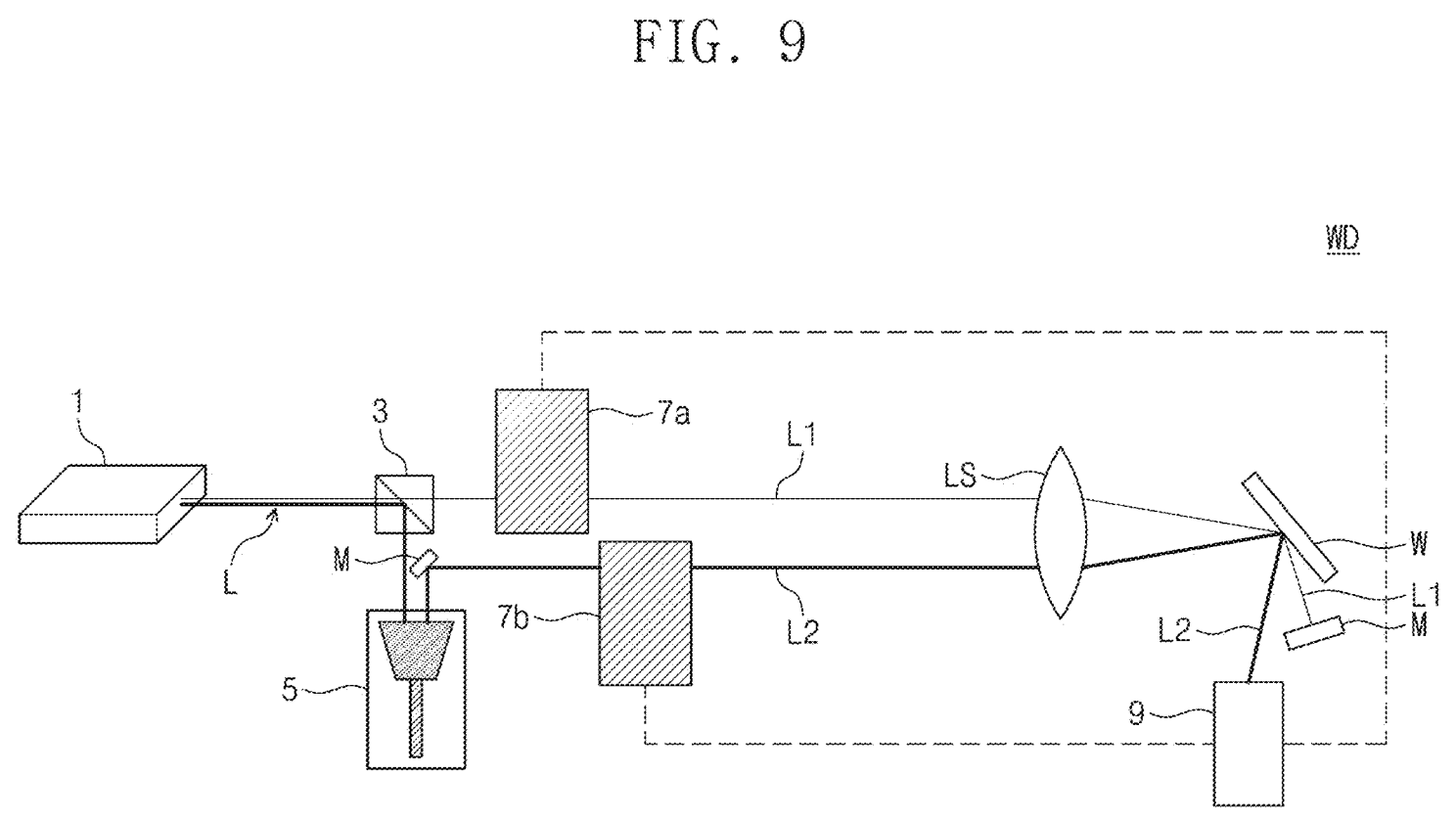
Figure 10:
FIG. 10 is a schematic view illustrating an example substrate inspection apparatus.
Figure 10:
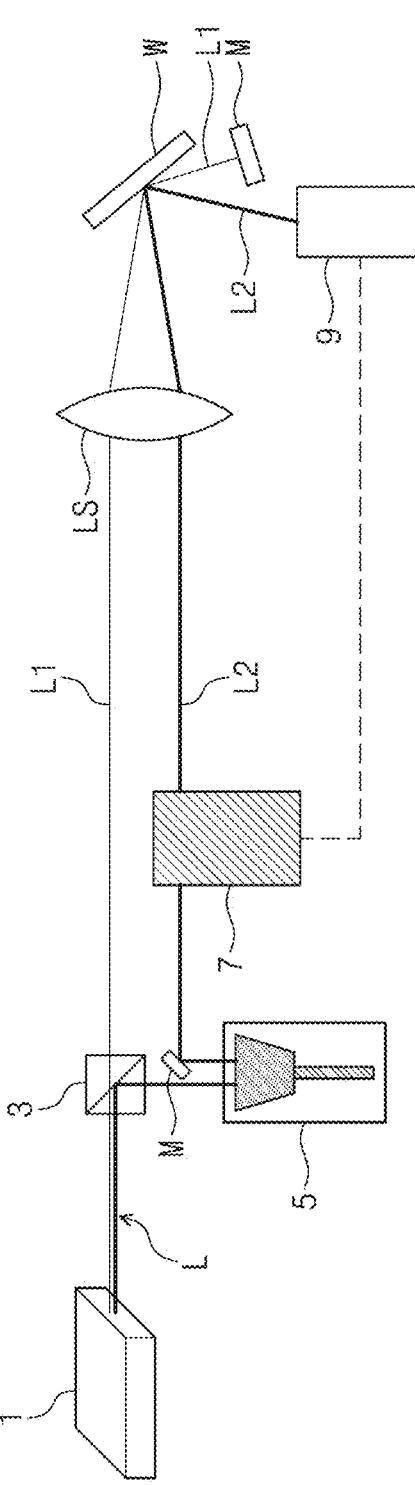

FIG. 9 is a schematic view illustrating an example substrate inspection apparatus. FIG. 10 is a schematic view illustrating an example substrate inspection apparatus.

Substrate inspection apparatuses WD of FIGS. 9 and 10 can be other examples of the substrate inspection apparatus WD of FIG. 1. FIG. 9 illustrates the substrate inspection apparatus WD including a plurality of modulators 7a and 7b. The substrate inspection apparatus WD can include a first modulator 7a and a second modulator 7b. The first modulator 7a can be configured to receive the first laser beam L1. The first modulator 7a can be optically connected to the optical splitter 3. The first modulator 7a can be configured to change the first laser beam L1. The first modulator 7a can include the gratings 71 and 75 and the optical modulator 73. The second modulator 7b can be configured to receive the second laser beam L2. The second modulator 7b can be optically connected to the delay stage 5. The second modulator 7b can include the gratings 71 and 75 and the optical modulator 73. The first modulator 7a and the second modulator 7b can be configured to receive electrical feedback from the feedback system 9. Shapes and/or refractive indexes of the first modulator 7a and the second modulator 7b can be changed by the feedback system 9. Referring to FIG. 10, the modulator 7 can be configured to receive only the second laser beam L2. The modulator 7 can be optically connected to the delay stage 5.

According to the substrate inspection apparatus and the method of inspecting a substrate using the same, the properties of the first laser beam and the second laser beam can be changed.

More particularly, the wavefronts of the split laser beams can be changed by the modulator. The wavefronts of the split laser beams can be changed by changing the surface of the optical modulator. The wavefronts of the split laser beams can be variously changed by the surface of the optical modulator. Since the wavefronts of the split laser beams can be changed, a heating profile of the substrate can be changed. Since the heating profile of the substrate can be changed, sound waves generated from the substrate can also be changed by a photoacoustic effect. A travelling direction of the sound waves in the substrate can be adjusted by the changing of the sound waves. Physical properties of the substrate can be selectively measured using construction and interference effects of the sound waves. The sound waves can be analyzed to detect defects in the substrate.

According to the substrate inspection apparatus and the method of inspecting a substrate using the same, the intensity of the laser beam (e.g., the split laser beams) for each frequency can be changed by the optical modulator to change the pulse shape of the laser beam. The pulse shape of the laser beam can show the intensity of the laser beam for each time. The pulse shape of the laser beam can correspond one-to-one to the intensity of the laser beam for each frequency. A deeper place in the substrate can be analyzed by the changed split laser beams. Defects or a layer in the substrate can be analyzed in detail by the changed split laser beams. The changed split laser beams can be analyzed to detect or check a thickness of the substrate and a change of a medium of the substrate.

According to the substrate inspection apparatus and the method of inspecting a substrate using the same, the modulator can be changed by the feedback system to easily analyze the substrate. The feedback system can apply electrical stimulation to the modulator to change a shape of a surface of the modulator or to change a refractive index of the modulator. More particularly, the feedback system can apply electrical stimulation to the modulator to change the surface of the PZT. The feedback system can apply electrical stimulation to the modulator to change an alignment degree of the crystal molecules of the SLM, thereby changing the refractive index of the modulator.

According to the substrate inspection apparatus and the method of inspecting a substrate using the same, the intensity of the laser for each frequency can be changed.

According to the substrate inspection apparatus and the method of inspecting a substrate using the same, the wavefront of the laser can be changed.

According to the substrate inspection apparatus and the method of inspecting a substrate using the same, the internal structure of the substrate can be inspected in detail.

According to the substrate inspection apparatus and the method of inspecting a substrate using the same, a desired layer in the substrate can be intensively inspected.

While this disclosure contains many specific implementation details, these should not be construed as limitations on the scope of what can be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features can be described above as acting in certain combinations, one or more features from a combination can in some cases be excised from the combination, and the combination can be directed to a subcombination or variation of a subcombination.

While the implementations have been particularly shown and described, it will be understood by one of ordinary skill in the art that variations in form and detail can be made therein without departing from the spirit and scope of the attached claims.

What is claimed is:

1. A substrate inspection apparatus comprising:
a laser light source configured to emit a laser beam;
an optical splitter configured to split the laser beam into a first laser beam and a second laser beam;
a delay stage optically connected to the optical splitter and configured to change a relative time delay of the second laser beam with respect to the first laser beam;
a first modulator optically connected to the optical splitter and configured to change the first laser beam; and
a feedback system configured to sense the second laser beam reflected from a substrate and configured to apply electrical feedback to the first modulator.

2. The substrate inspection apparatus of claim 1, wherein the first modulator comprises: a first optical modulator configured to change an intensity of the first laser beam for each wavelength, and
wherein the first optical modulator includes a spatial light modulator.

3. The substrate inspection apparatus of claim 2, wherein the first modulator further comprises: a first grating optically connected to the optical splitter and configured to divide the first laser beam.

4. The substrate inspection apparatus of claim 3, wherein the first modulator further comprises: a second grating optically connected to the first modulator and configured to focus the divided first laser beam, and wherein the first optical modulator is located between the first grating and the second grating.

5. The substrate inspection apparatus of claim 1, wherein the first modulator comprises: a first optical modulator configured to change a wavefront of the first laser beam, and wherein the first optical modulator includes a piezoelectric transducer, the piezoelectric transducer having a shape of a surface configured to be changed by an applied voltage.

6. The substrate inspection apparatus of claim 5, wherein the first modulator further comprises: a second optical modulator configured to change an intensity of the first laser beam for each wavelength, and wherein the second optical modulator includes a spatial light modulator configured to change a refractive index of a medium through which the first laser beam propagates depending on a direction and an intensity of an applied electric field.

7. The substrate inspection apparatus of claim 1, wherein the laser light source includes a femtosecond laser light source configured to generate the laser beam having a waveform of a pulse shape.

8. The substrate inspection apparatus of claim 1, further comprising:

a second modulator optically connected to the delay stage and configured to change the second laser beam, wherein the feedback system is electrically connected to the second modulator.

9. The substrate inspection apparatus of claim 8, wherein the second modulator includes a piezoelectric transducer configured to change a wavefront of the second laser beam or a spatial light modulator configured to change an intensity of the second laser beam for each wavelength.

10. A substrate inspection apparatus comprising:

a laser light source configured to emit a femtosecond laser beam;

an optical splitter configured to split the femtosecond laser beam into a first laser beam and a second laser beam;

a delay stage configured to receive the second laser beam from the optical splitter and configured to change a relative time delay of the second laser beam with respect to the first laser beam;

a modulator optically connected to the optical splitter and configured to change the second laser beam; and a feedback system configured to sense the second laser beam reflected from a substrate and electrically connected to the modulator.

11. The substrate inspection apparatus of claim 10, wherein a pulse width of the femtosecond laser light generated from the laser light source ranges from 10 fs to 60 fs.

12. The substrate inspection apparatus of claim 10, wherein the modulator comprises: an optical modulator configured to change a waveform of the second laser beam or an intensity of the second laser beam for each frequency.

13. The substrate inspection apparatus of claim 12, wherein the optical modulator includes a piezoelectric transducer having a surface, a shape of the surface being configured to be changed by a voltage, or a spatial light modulator having crystal molecules with an alignment direction configured to be changed by an electric field.

14. The substrate inspection apparatus of claim 12, wherein the modulator further comprises: a grating including a plurality of slits arranged at equal distances.

15. The substrate inspection apparatus of claim 10, further comprising:

a lens configured to focus the femtosecond laser light split by the optical splitter again and optically connected to the delay stage or to the modulator.

* * * * *